United States Patent
Oyu et al.

(10) Patent No.: US 9,955,619 B2
(45) Date of Patent: Apr. 24, 2018

(54) LIGHT EMITTING DEVICE, LIGHT EMITTING ELEMENT MOUNTING METHOD, AND LIGHT EMITTING ELEMENT MOUNTER

(71) Applicant: NICHIA CORPORATION, Anan-shi (JP)

(72) Inventors: Takahiro Oyu, Chiyoda-ku (JP); Tadaaki Miyata, Yokohama (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/191,203

(22) Filed: Feb. 26, 2014

(65) Prior Publication Data

US 2014/0239331 A1    Aug. 28, 2014

(30) Foreign Application Priority Data

Feb. 27, 2013  (JP) .................................. 2013-037982

(51) Int. Cl.
  *H01L 33/50* (2010.01)
  *H01L 33/60* (2010.01)
  (Continued)

(52) U.S. Cl.
  CPC ........... *H05K 13/046* (2013.01); *H01L 24/75* (2013.01); *H01L 33/505* (2013.01); *H01L 33/62* (2013.01); *H05K 13/0469* (2013.01); *H01L 33/46* (2013.01); *H01L 2224/73204* (2013.01); *H01L 2224/83192* (2013.01); *H01L 2933/0066* (2013.01); *H05K 3/321* (2013.01); *H05K 2201/10106* (2013.01); *H05K 2203/0195* (2013.01); *Y10T 29/4913* (2015.01); *Y10T 29/53178* (2015.01)

(58) Field of Classification Search
  None
  See application file for complete search history.

(56) References Cited

U.S. PATENT DOCUMENTS

| 5,499,052 A * | 3/1996 | Nakanishi ............ G11B 31/006 348/220.1 |
| 2002/0187571 A1* | 12/2002 | Collins, III ............ C25D 13/02 438/29 |

(Continued)

FOREIGN PATENT DOCUMENTS

| JP | 02-226610 A | 9/1990 |
| JP | 09-008360 A | 1/1997 |

(Continued)

OTHER PUBLICATIONS

International Search Report issued in International Application No. PCT/JP2014/054618 dated May 27, 2014.

(Continued)

*Primary Examiner* — Kimberly Rizkallah
*Assistant Examiner* — Bo Bin Jang
(74) *Attorney, Agent, or Firm* — Foley & Lardner LLP

(57) ABSTRACT

Disclosed is a light emitting device including: a light emitting element including an LED chip and a phosphor layer provided at the light emitting side of the LED chip; and a substrate on which the light emitting element is bonded by an adhesive material. The adhesive material is an anisotropic conductive material.

14 Claims, 13 Drawing Sheets

(51) Int. Cl.
  H05K 13/04  (2006.01)
  H01L 33/62  (2010.01)
  H01L 23/00  (2006.01)
  H01L 33/46  (2010.01)
  H05K 3/32  (2006.01)

(56) References Cited

U.S. PATENT DOCUMENTS

| | | | |
|---|---|---|---|
| 2005/0045899 A1 | 3/2005 | Tsutsui | |
| 2008/0023711 A1* | 1/2008 | Tarsa | H01L 33/486 257/98 |
| 2009/0166657 A1* | 7/2009 | Yamada | H01L 33/60 257/98 |
| 2011/0147778 A1* | 6/2011 | Ichikawa | 257/98 |
| 2011/0198649 A1 | 8/2011 | Yamada | |
| 2011/0266578 A1* | 11/2011 | Kanisawa et al. | 257/98 |
| 2012/0037942 A1* | 2/2012 | Sanga | H01L 33/60 257/98 |
| 2012/0193666 A1* | 8/2012 | Namiki | C09J 163/00 257/98 |
| 2012/0248483 A1* | 10/2012 | Beppu | H01L 33/505 257/98 |
| 2013/0341666 A1* | 12/2013 | Yoshida | H01L 33/501 257/98 |
| 2014/0217450 A1* | 8/2014 | Ishigami | H01B 1/22 257/98 |

FOREIGN PATENT DOCUMENTS

| | | |
|---|---|---|
| JP | 11-111406 A | 4/1999 |
| JP | 2001-085749 A | 3/2001 |
| JP | 2002-217611 A | 8/2002 |
| JP | 2003-031599 A | 1/2003 |
| JP | 2003-057650 A | 2/2003 |
| JP | 2003-209286 A | 7/2003 |
| JP | 2004-039983 A | 2/2004 |
| JP | 2006-324373 A | 11/2006 |
| JP | 2009-170698 A | 7/2009 |
| JP | 2010-283267 A | 12/2010 |
| JP | 2011-009572 A | 1/2011 |
| JP | 2011-171376 A | 9/2011 |
| JP | 2011-243666 A | 12/2011 |
| JP | 2012-142362 A | 7/2012 |
| JP | 2013-012544 A | 1/2013 |

OTHER PUBLICATIONS

Translation of International Search Report issued in International Application No. PCT/JP2014/054618 dated May 27, 2014.

English language translation of International Preliminary Report on Patentability issued in PCT/JP2014/054618, dated Sep. 1, 2015.

* cited by examiner

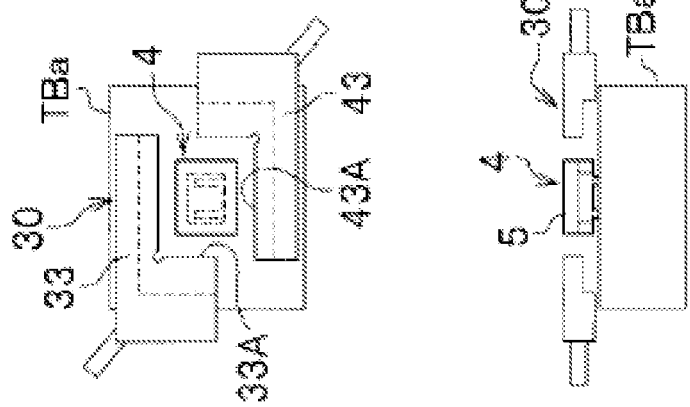
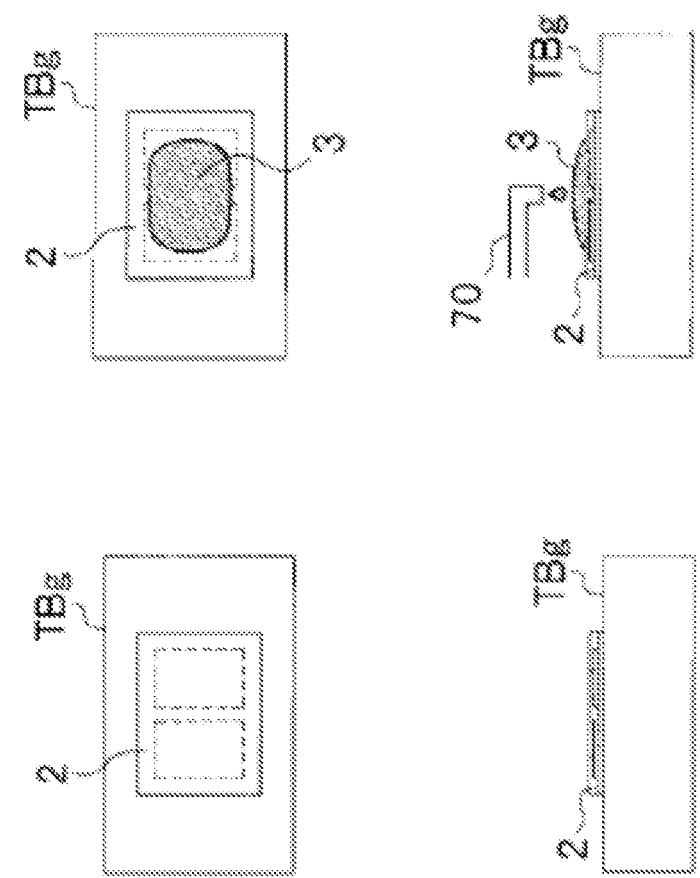

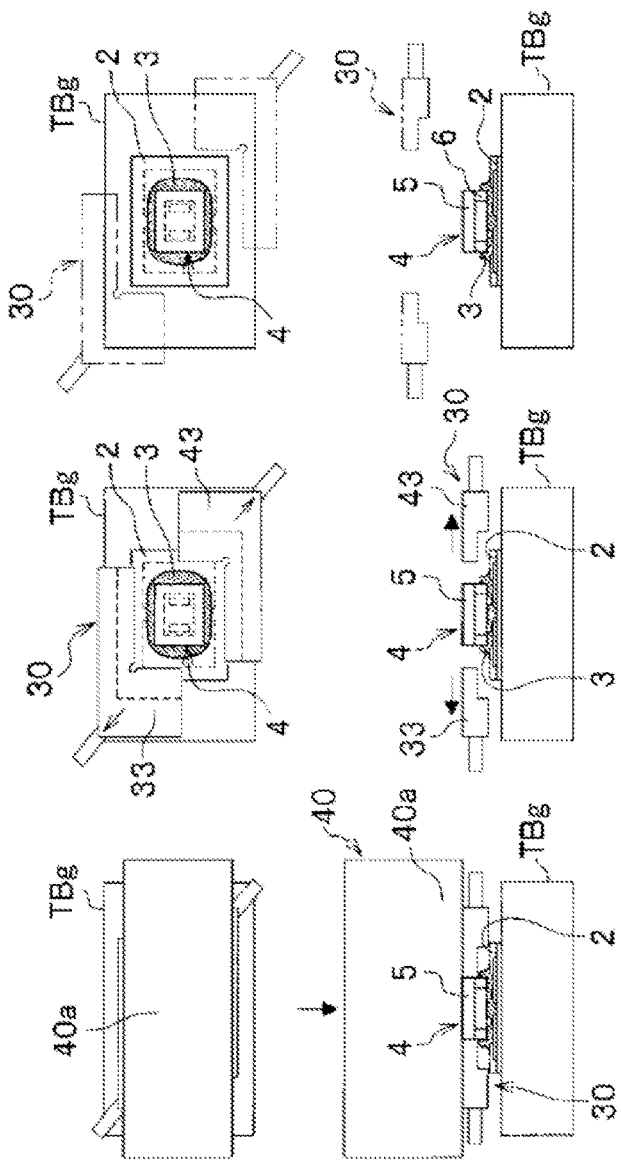

LIGHT EMITTING DEVICE, LIGHT EMITTING ELEMENT MOUNTING METHOD, AND LIGHT EMITTING ELEMENT MOUNTER

CROSS-REFERENCE TO RELATED APPLICATIONS

This application claims priority to and the benefit of Japanese Patent Application No. 2013-037982 filed Feb. 27, 2013, the entire contents of which is incorporated herein by reference.

BACKGROUND OF THE INVENTION

1. Field of the Invention

The present invention relates to a light emitting device using a light emitting element, a light emitting element mounting method for mounting the light emitting element of the light emitting device, and a light emitting element mounter.

2. Description of Related Art

Typical light emitting devices using a semiconductor light emitting element include a substrate and a light emitting element mounted thereon. For mounting light emitting elements, a variety of mounting methods have been proposed. An example of such mounting methods includes a former step of applying adhesive onto an element mount area of a substrate by means of a dispenser or the like, and a latter step of bonding and mounting a semiconductor light emitting element on the element mount area (see, JP 2011-243666 A). Upon mounting a semiconductor light emitting element in such methods, the semiconductor light emitting element is typically conveyed to and mounted on an adhesive applied on a substrate by holding its upper face by suction by means of a suction pad or a die collet.

In recent days, a combination of an LED chip with a phosphor layer applied on one side thereof has become known as a type of light emitting element (see, JP 2011-009572 A). Such light emitting elements are referred to as chip size packages, where a phosphor layer or a light reflection layer is previously provided on an LED chip before it is mounted on a substrate.

Such light emitting elements are mounted such that their electrodes are opposed to the substrate (flip-chip mount), where solder or the like is used as the adhesive for the mounting, which joins the light emitting element to the substrate at a high temperature.

SUMMARY OF THE INVENTION

However, there is the following problem with the above-mentioned conventional light emitting devices and mounters and mounting methods of light emitting elements.

Because a light emitting element is mounted on a substrate by using solder or the like that is used at a high temperature, conventional light emitting devices require a substrate that is resistant to such high temperatures during the mounting process, which results in narrow options for the material of the substrate.

The disclosure was made in view of the above-mentioned problems, and an object thereof is to provide a light emitting device in which a light emitting element can be connected (bonded) to a substrate at a low temperature, and to provide a light emitting element mounter and a light emitting element mounting method.

In order to solve the above-mentioned problem, one embodiment of the present invention is the following light emitting device, light emitting element mounting method, and light emitting element mounter.

That is, the light emitting device includes: a light emitting element including an LED chip and a phosphor layer provided on a light emitting side of the LED chip; and a substrate on which the light emitting element is bonded by an adhesive material, wherein the adhesive material is an anisotropic conductive material.

Relating to light emitting devices, there is also a need for the following method and apparatus in addition to the above-mentioned problems. That is, upon mounting, a light emitting element is subjected to a load because its upper surface is held by suction, which may cause deformation of the light emitting element. Such deformation may cause undesired light distribution, poor color uniformity, decreased brightness and the like. Therefore, there is a need for methods of mounting light emitting elements and light emitting element mounters that can prevent deformation of light emitting elements of light emitting devices, and can fabricate light emitting devices with high light extraction efficiency.

To address the above-mentioned need, another embodiment of the present invention is the following light emitting element mounting method. That is, a light emitting element mounting method for mounting a light emitting element on a substrate includes the steps of: placing the light emitting element on an adhesive material provided on the substrate, the light emitting element including an LED chip and a phosphor layer provided on a light emitting side of the LED chip, the adhesive material being an anisotropic conductive material; and curing the adhesive material while a guide is abutting a side face of the phosphor layer of the placed light emitting element.

Further, to address the above-mentioned need, still another embodiment of the present invention is the following light emitting element mounter. That is, a light emitting element mounter for mounting the light emitting element on a substrate by joining the light emitting element by an adhesive material of an anisotropic conductive material, the light emitting element including an LED chip and a phosphor layer provided on a light emitting side of the LED chip, includes: a guide mechanism apparatus to hold the phosphor layer by abutting a side face of the phosphor layer; and a curing apparatus to cure the adhesive material while the guide apparatus is holding the phosphor layer.

The light emitting device, the light emitting element mounting method, and the light emitting element mounter have the following advantageous effects.

In the light emitting device, because the LED chip is mounted on the substrate by using an anisotropic conductive material as the adhesive material, the mounting process can be performed at a lower temperature compared to by using solder. Therefore, high reliability of the circuit and the like can be ensured.

In the light emitting element mounting method, the light emitting element can be mounted on the substrate at a lower temperature compared to by using solder. Therefore, high light extraction efficiency as well as high reliability of the circuit or the like can be ensured.

In the light emitting element mounter, the mounted light emitting element can be prevented from developing uneven light distribution, poor color uniformity and decreased brightness. Furthermore, the light extraction efficiency can be improved.

BRIEF DESCRIPTION OF THE DRAWINGS

FIGS. 7A to 7E are schematic views illustrating the flow of the mounting process in the light emitting element mounter according to an embodiment of the present invention.

FIGS. 8A to 8D are schematic views illustrating the flow of the mounting process in the light emitting element mounter according to an embodiment of the present invention.

DETAILED DESCRIPTION OF THE EMBODIMENTS

Figure 1:
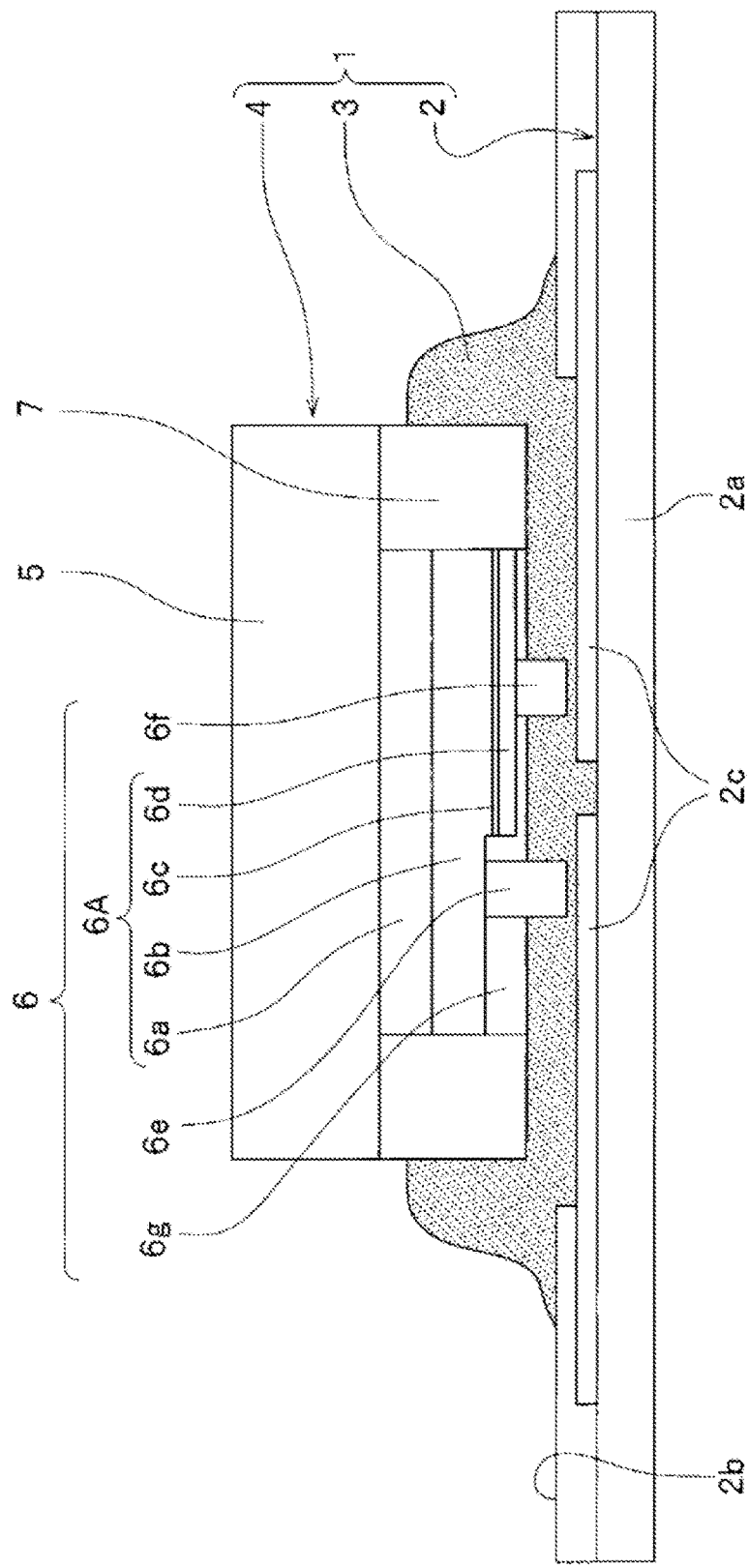
FIG. 1 is a cross sectional view schematically illustrating a whole light emitting device according to an embodiment of the present invention.

A light emitting device using a semiconductor light emitting element, a light emitting element mounting method for mounting a light emitting element of the light emitting device, and a light emitting element mounter according to embodiments of the present invention will be described below with reference to the accompanying drawings. In the following description, an exemplary configuration of the light emitting device will be firstly described, and thereafter an exemplary configuration of the light emitting mounter and an exemplary method for mounting a light emitting element will be described. The illustration of components or the like may be partly or fully exaggerated in the drawings. Furthermore, for improving readability, diagonal lines (hatching) for indicating a cross section may be omitted even in some cross sectional views.

Figure 2:
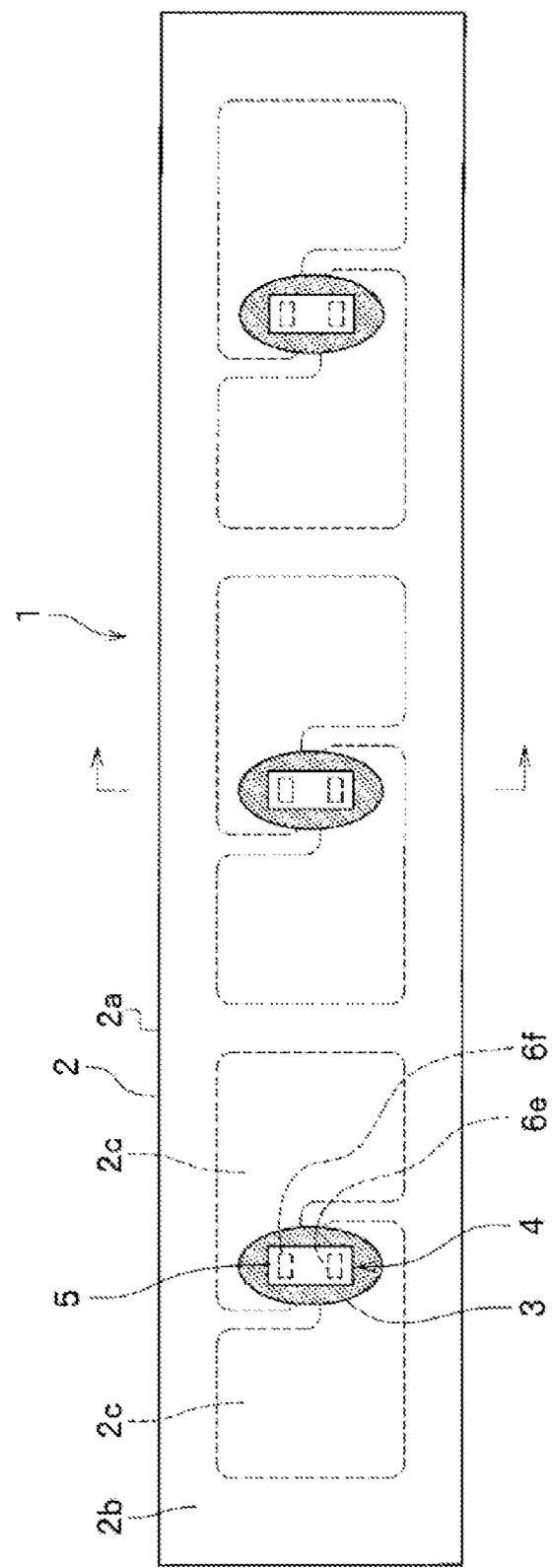
FIG. 2 is a plan view schematically illustrating an example of the light emitting device according to an embodiment of the present invention, where three light emitting elements are mounted on a substrate.

As illustrated in FIGS. 1 and 2, the light emitting device 1 of an embodiment includes a mounting substrate (substrate) 2 on which a circuit and the like are formed, and a light emitting element 4 provided on the mounting substrate 2 interposing an adhesive material 3 of an anisotropic conductive material.

The light emitting element 4 may be configured in an approximate rectangular shape in a plan view, and includes: an LED chip 6 that includes a semiconductor light emitting element structure 6A laminated on a sapphire substrate 6a and may be configured in a rectangular shape in a plan view; a phosphor layer 5 provided on an upper face (on the side of the sapphire substrate 6a), i.e. on the light extracting face of the LED chip 6; and a light reflective component layer 7 covering the side faces of the LED chip 6 (i.e. the side faces of the sapphire substrate 6a and the side faces of the semiconductor light emitting structure 6A).

Figure 13:
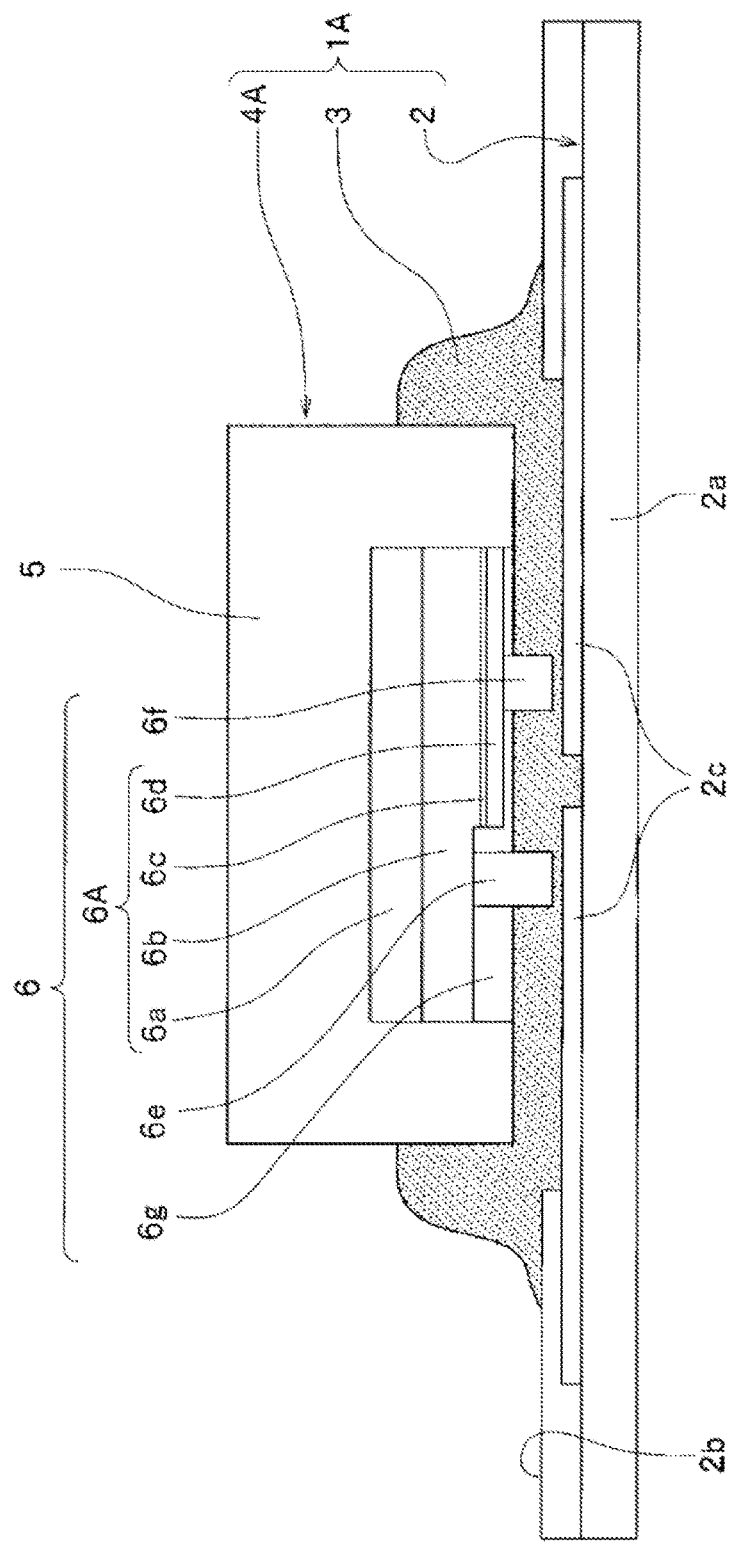
FIG. 13 is a cross sectional view schematically illustrating another light emitting device according to an embodiment of the present invention.

The side faces of the LED chip 6 may not be covered with the light reflective component layer 7, and may be exposed for example. Alternatively, the phosphor layer 5 may be provided on the side faces of the LED chip 6 as well (see FIG. 13).

As the components of the semiconductor light emitting element structure 6A laminated on the translucent sapphire substrate 6a, the LED chip 6 includes an n-layer (n-type semiconductor layer) 6b, a p-layer (p-type semiconductor layer) 6d formed over the n-layer 6b, an active layer 6c formed between the n-layer 6b and the p-layer 6d, an n-pad electrode 6e formed on the part of the n-layer 6b where the p-layer is not laminated, a p-pad electrode 6f formed on the p-layer 6d, and a protective film 6g configured to expose the end face of the n-pad electrode 6e and the end face of the p-pad electrode 6f.

The semiconductor light emitting element structure 6A of the LED chip 6 is preferably made of a GaN nitride semiconductor, and specifically, may include $In_xGa_{1-x}N$ (0<x<1) as the active layer 6c. With this structure, the semiconductor light emitting structure 6A can be fabricated into the LED chip 6 that has high luminous efficiency within a wavelength range of 365 nm or longer, preferably 380 nm or longer, yet more preferably from 400 nm to 680 nm.

In the LED chip 6, it is preferred that the n-pad electrode 6e, which is electrically connected to the n-layer 6b, extends beyond the p-layer 6d via the insulating material layer. This structure permits the large area n-pad electrode 6e without largely decreasing the area of the active layer 6c, which facilitates pressurization by a curing apparatus 40. Furthermore, the increased opposed area between the pad electrodes and connector electrodes of the mounting substrate 2 can provide good electrical joining (connection) even if an anisotropic conductive material is used for the adhesive material 3. It is preferred that the p-pad electrode 6f and the n-pad electrode 6e have approximately the same size and shape. This can facilitate the mounting process as well as can spread the stress acting on the LED chip 6.

In this embodiment, it is preferred that the phosphor layer 5 is configured in a rectangular shape in a plan view and is made of a translucent resin containing a phosphor. The translucent resin is preferably translucent to the light from the LED chip 6, and preferably has light fastness and insulation property. Specifically, examples of the resin include a silicone resin composition, a modified silicone resin composition, an epoxy resin composition, a modified epoxy resin composition, an acrylic resin composition, a silicone resin, an epoxy resin, an urea resin, a fluororesin, and a hybrid resin containing at least one of these resins. As used herein, the term "translucent" means a property of transmitting approximately 70% or more, preferably approximately 80% or more, more preferably approximately 90% or more, and still more preferably approximately 95% or more of the light emitted from the LED chip. A useful example of the phosphor layer 5 converts blue light to yellow light by wavelength conversion. This enables readily extracting white light.

The phosphor layer 5 can be formed by a variety of methods. For example, a phosphor contained in a binder such as a resin as mentioned above may be applied by coating, printing, compression molding or the like. Alternatively, a phosphor may be applied on the light emitting element by electrodeposition, sputtering or the like, and then the phosphor may be impregnated with a binder such as a resin or glass.

The upper face of the light emitting element may be flat, or may be configured in a concave or convex shape or may have a convex lens-shaped portion at the center. These structures are expected to provide a variety of advantageous effects such as improved light extraction efficiency. In the method for mounting a light emitting device according to an embodiment of the present invention, even such light emitting elements with a convex, concave or lens-shaped upper face can be readily mounted by applying pressure and heat because the light emitting elements are held at their side faces in the mounting process.

The light reflective component layer 7 is disposed on the side faces of the LED chip 6 to reflect the light from the LED chip 6. It is preferred that the light reflective component layer 7 is provided on the LED chip 6 such that the light reflective component layer 7 continues with the phosphor layer 5. The light reflective component layer 7 may be made of a reflective material contained in a binder resin such as a silicone resin, a modified silicone resin, an epoxy resin, a modified epoxy resin, an acrylic resin or a hybrid resin including at least one of these resins. The reflective material may be made of titanium oxide, silicon dioxide, titanium dioxide, zirconium dioxide, potassium titanate, alumina, aluminum nitride, boron nitride or the like. Because the light transmissivity and reflectivity of the light reflective component layer 7 depend on the concentration or density of the reflective material, the concentration or density may be suitably adjusted according to the shape and size of the light emitting device 1. It is preferred that the light reflective component layer 7 has high light reflectivity and high light fastness. Specifically, titanium oxide contained in a silicone resin may be suitably used.

Alternatively, a reflective material as mentioned above may be applied by sputtering or the like without using a binder.

It is preferred that the light reflective component layer 7 covers the whole side faces of the LED chip 6. This can prevent the light from the LED chip 6 from leaking out without wavelength conversion by the phosphor layer 5. Therefore, poor color uniformity of the light emitting device 1 can be prevented.

The light reflective component layer 7 is preferably harder than the phosphor layer 5. This enables a guide mechanism 30 to abut both of the light reflective component layer 7 and the phosphor layer 5 in the mounting process mentioned below, which can further prevent deformation of the phosphor layer 5.

It is preferred that the side faces of the light reflective component layer 7 are approximately flush with the side faces of the phosphor layer 5. This can facilitate the abutment with the guide mechanism 30.

Further, the light reflective component layer 7 may contain a wavelength conversion component such as the above-mentioned phosphors.

The mounting substrate 2 is made of, for example, a film base 2a and connector electrodes 2c formed on the film base 2a, on which a substrate light reflective component layer 2b of titanium oxide contained in a silicone resin is applied except for the area to be connected to the LED chip 6.

The mounting substrate 2 may be made of any material, and for example, includes a base of insulating resin such as polyimide or polyethylene terephthalate and the connector electrodes 2c of Cu or Al formed thereon. The connector electrodes 2c may have any structure that can be used for the mounting substrate 2, for example, a conductive ink or plating. The base may also be made of ceramics or metal with insulation finish. The mounting substrate 2 may have any thickness, however as a flexible substrate, may have a thickness of, for example, approximately from 10 μm to 100 μm. The mounting substrate 2 may also be configured in any shape, such as rectangular, tape and circular shapes. On the mounting substrate 2, the LED chip 6 is mounted by using an anisotropic conductive material for the adhesive material 3, which is capable of joining components at a lower temperature than solder or the like. By using an anisotropic conductive material for the adhesive material, low heat-resistant materials such as polyethylene terephthalate can be used for the mounting substrate 2. The definition and the like of the anisotropic conductive material are mentioned below.

The adhesive material 3 is used for mounting (bonding) the LED chip 6 on the mounting substrate 2. In this embodiment, the adhesive material 3 electrically connects the n-pad electrode 6e and p-pad electrode 6f of the LED chip 6 to the corresponding connector electrodes 2c formed on the mounting substrate 2. The adhesive material 3 may be disposed extending continuously from the mounting substrate 2 to the whole or a part of the light reflective component layer 7. The adhesive material 3 contains conductive particles and a binder. The conductive particles build electrical connection between the pad electrodes of the LED chip 6 and the corresponding connector electrodes 2c of the mounting substrate 2, while the binder mechanically fixes the light emitting element 4 on the mounting substrate 2.

The adhesive material 3 may be made of any material. For example, the conductive particles may include elastic resin particles with a metal-coated surface, or gold-plated Ni particles. The binder of the adhesive material 3 may be made of, for example, a thermosetting resin such as an epoxy resin and a silicone resin or a synthetic rubber resin {(thermosetting and thermoplastic mixed type), (polyester-based (oil-free alkyd resin [resin obtained by polycondensing a polybasic acid with a polyalcohol]), (chloroprene, zinc oxide, zinc sulfide, aromatic compound, etc.))}.

It is preferred that the adhesive material 3 contains a light reflective material. This can increase the light reflectivity of the adhesive material 3, which eventually increases the light extraction efficiency of the light emitting device 1. Specifically, titanium oxide, silicon dioxide, titanium dioxide, zirconium dioxide, potassium titanate, alumina, aluminum nitride, boron nitride and the like can be used.

The light emitting device 1 with the above-mentioned configuration can be used for a linear light source, which can be a substitute of fluorescence lamps, for example by mounting a plurality of the light emitting elements 4 (three pieces in the drawing) on a rectangular mounting substrate 2 at regular intervals as illustrated in FIG. 2. It should be understood that the light emitting device 1 may include only one light emitting element 4 mounted on the mounting substrate 2. Because an anisotropic conductive material is used as the adhesive material 3 for bonding the light emitting element 4 on the mounting substrate 2, the mounting process can be performed at a lower temperature than by using solder. Therefore, the light emitting device 1 can be made of a broad range of materials, and has wide possibility of the design. Because the side faces of the phosphor layer 5 are exposed from the adhesive material 3 (the adhesive material 3 is not adhered on the phosphor layer 5), the light emitting device 1 exhibits high light extraction efficiency.

Next, an embodiment of a light emitting element mounter 10 for mounting the light emitting element 4 on the mounting substrate 2 will be described.

Figure 3:
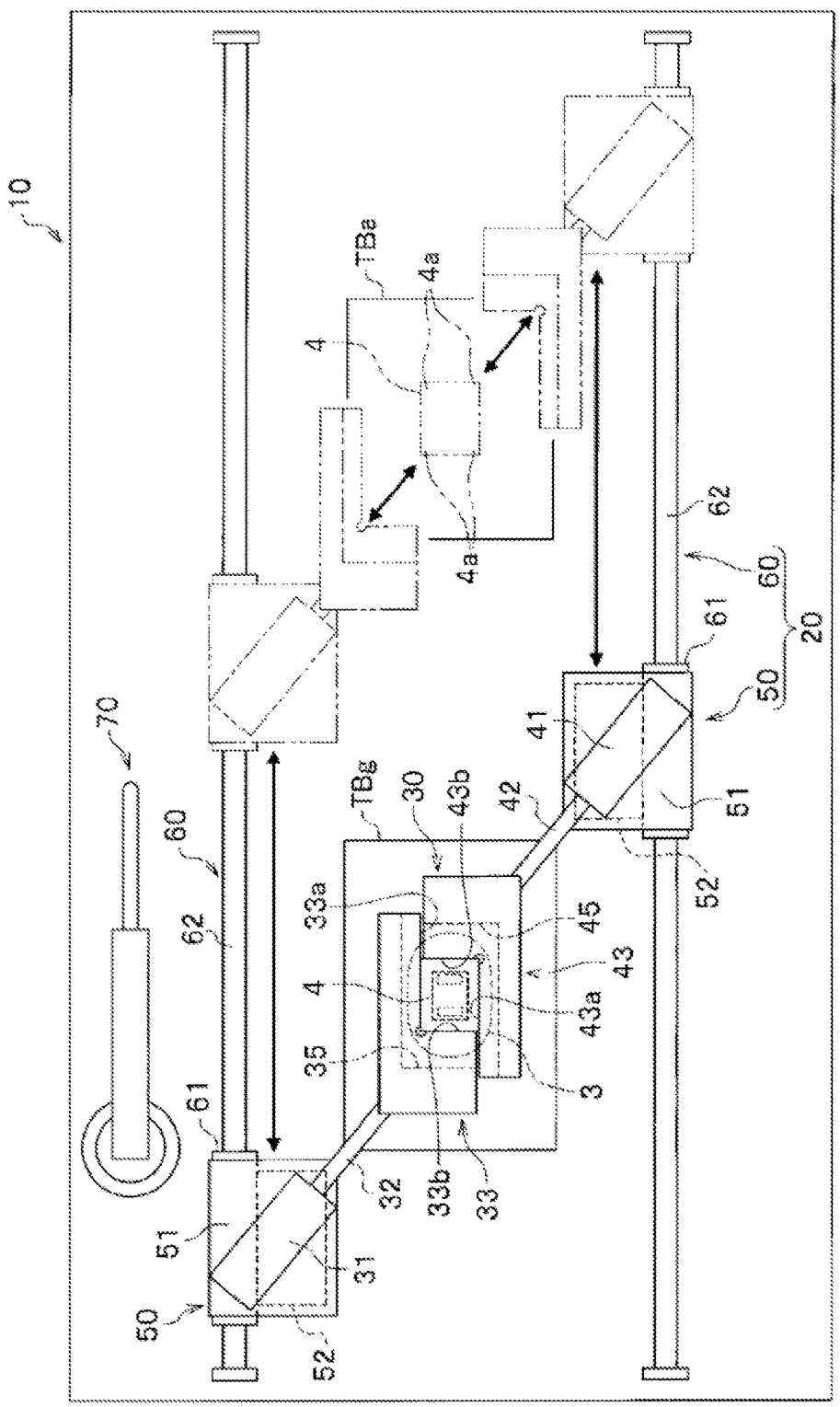
FIG. 3 is a plan view schematically illustrating a whole light emitting element mounter according to an embodiment of the present invention.
Figure 4:
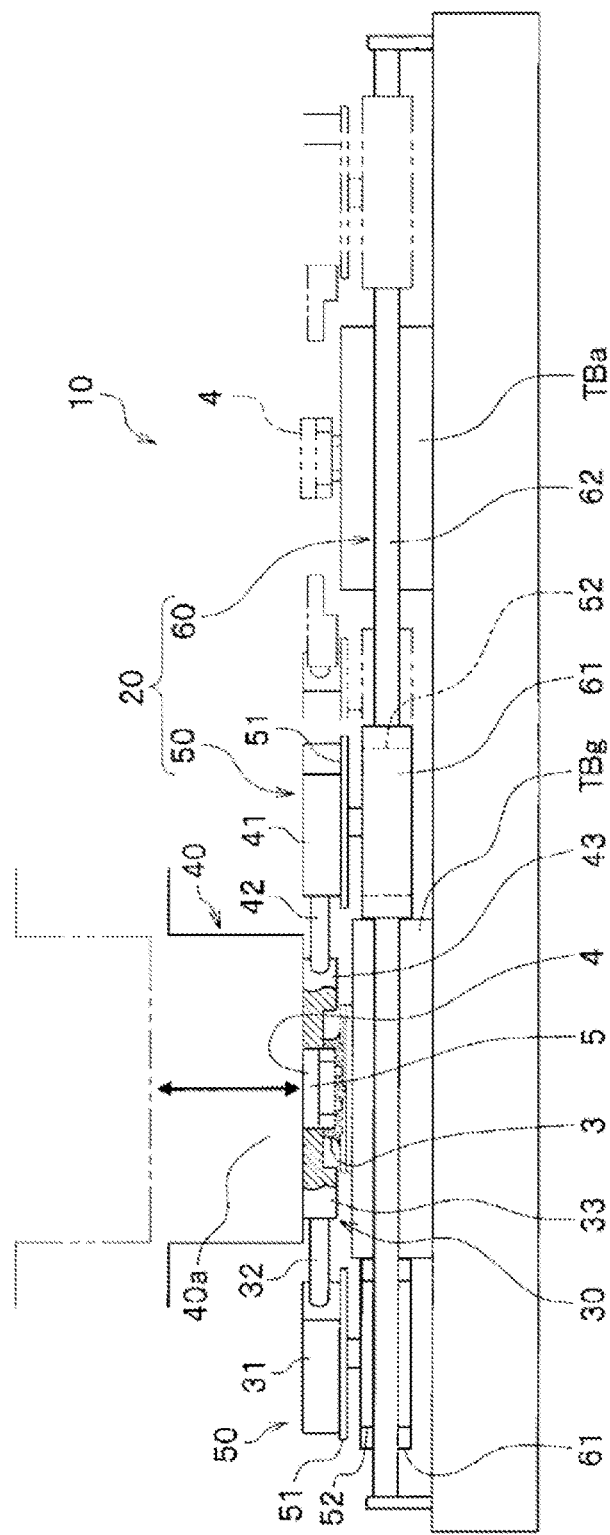
FIG. 4 is a side view schematically illustrating the whole light emitting element mounter according to an embodiment of the present invention.

As illustrated in FIGS. 3 and 4, the light emitting element mounter 10 may include a convey mechanism (convey apparatus) 20 to convey the light emitting element 4 onto the mounting substrate 2, a guide mechanism (guide apparatus) 30 to guide the light emitting element 4 conveyed by the convey mechanism 20, and a curing mechanism (cure apparatus) 40 to cure the adhesive material 3 so as to mount the light emitting element 4 guided by the guide mechanism 30 on the mounting substrate 2.

As illustrated in FIGS. 3 through 6, the guide mechanism 30 guides the phosphor layer 5 of the light emitting element 4 for preventing the phosphor layer 5 from deformation as well as from adhesion of the adhesive material 3 provided on the mounting substrate 2. The guide mechanism 30 may include a first guide driver 31, a second guide driver 41, a first guide arm 32, a second guide arm 42, a first abutting guide 33 and a second abutting guide 43. The first guide arm 32 and the second guide arm 42 are expandably and retractably attached to the first guide driver 31 and second guide driver 41, respectively. The first abutting guide 33 and the second abutting guide 43 are disposed at the distal ends of the first guide arm 32 and second guide arm 42, respectively. In terms of productivity, it is preferred that the guide mechanism 30 guides the phosphor layer 5 from opposite sides (two directions) of the light emitting element 4. For example, as illustrated in FIG. 3, the first guide arm 32 and the second guide arm 42 may be respectively coupled to the first abutting guide 33 and the second abutting guide 43 from opposite directions along a diagonal line of the light emitting element 4 which is configured in a rectangular shape in a plan view. This is advantageous because the side faces of the rectangular light emitting element can be readily guided.

Figure 5:
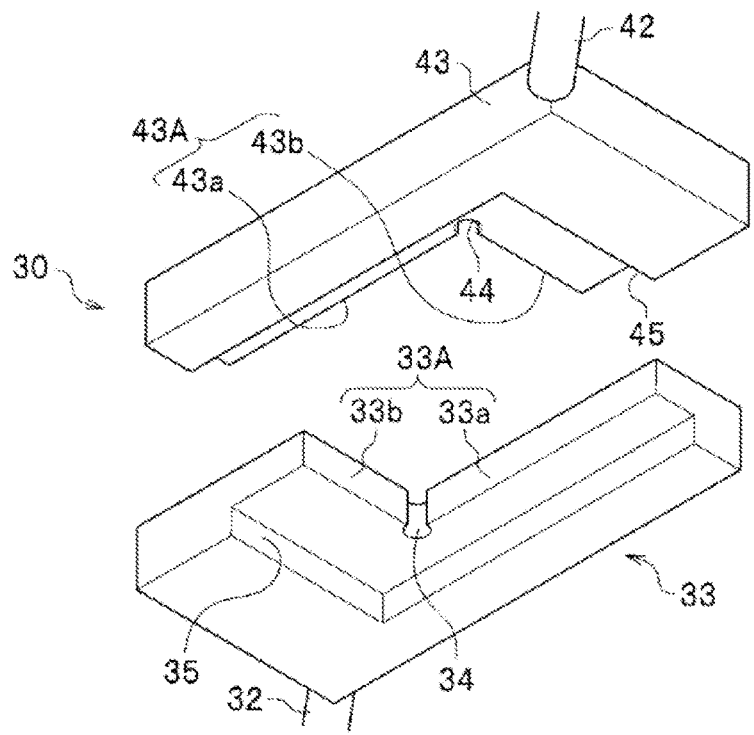
FIG. 5 is a view schematically illustrating a guide mechanism of the light emitting element mounter according to an embodiment of the present invention, specifically a perspective view from below of a first abutting guide member.
Figure 6:
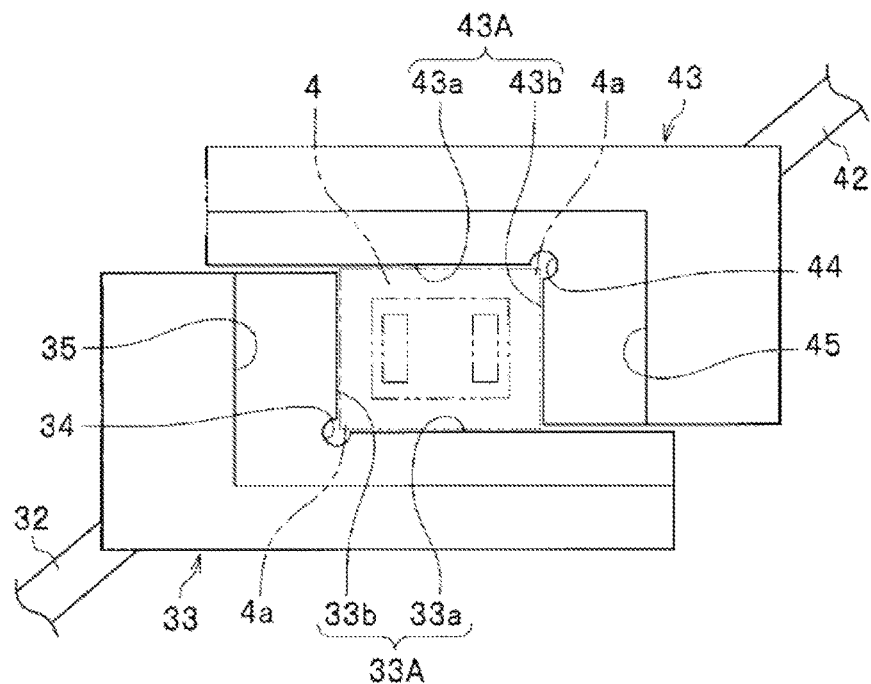
FIG. 6 is a bottom view from below, schematically illustrating the light emitting element mounter according to an embodiment of the present invention where the first abutting guide member and a second abutting guide member hold a phosphor layer of the light emitting element.

As illustrated in FIGS. 5 and 6, the first abutting guide 33 and the second abutting guide 43 of this embodiment respectively include steps 35 and 45 at the proximal sides to which the first guide arm 32 and the second guide arm 42 are coupled, and thus respectively include a first guide face 33A and a second guide face 43A, which are the lower end faces of the steps 35 and 45. The first guide face 33A of the first abutting guide 33 is configured to abut the side faces of the phosphor layer. For example, a guide face 33a for abutting a first side face of the phosphor layer 5, which is configured in a rectangular shape in a plan view (the phosphor layer 5 configured in a rectangular outer shape in a plan view), and a guide face 33b for abutting a second side face adjacent to the first side face are perpendicular to each other across a concave cutout 34 interposed therebetween (that is, the first abutting guide 33 includes the guide face 33a and the guide face 33b respectively configured to abut adjacent the first side face and the second side face of the rectangular phosphor layer 5. The concave cutout 34 is formed at an intersection of guide face 33a and the guide face 33b placed orthogonally each other, and the cutout 34 is configured not to come in contact with any of the side faces (the first side face and the second side face) of the phosphor layer.).

As for the second guide face 43A of the second abutting guide 43, a guide face 43a for abutting a third side face of the rectangular phosphor layer 5 and a guide face 43b for abutting a fourth side face adjacent to the third side face are perpendicular to each other across a concave cutout 44 interposed therebetween (that is, the second abutting guide 43 includes the second guide face 43a and the second guide face 34b respectively configured to abut adjacent the third side face and the fourth side face of the rectangular phosphor layer 5. The concave cutout 44 is formed at an intersection of guide face 43a and the guide face 43b placed orthogonally each other, and the cutout 44 is configured not to come in contact with any of the side faces (the third side face and the fourth side face) of the phosphor layer.). The first guide face 33A and the second guide face 43A are designed such that the guide faces 33b and 43b have the same length respectively as the second and fourth side faces of the phosphor layer 5, and the guide faces 33a and 43a are longer than the first and third side faces of the phosphor layer 5.

The abutting areas (or the height of the abutting areas) of the first guide face 33A and the second guide face 43A may be equal to or smaller than the height of the side faces of the phosphor layer 5. When the first guide face 33A and the second guide face 43A abut the phosphor layer 5, the lower edges of their guide faces 33a, 33b, 43a and 43b are located at the same position as the lower end of the phosphor layer 5 or at the side of the lower end of the phosphor layer 5 closer to the light reflective component layer 7 (i.e. the lower edges of the guide faces 33a, 33b, 43b and 43b are positioned lower than the lower end of the phosphor layer 5). This can prevent deformation of the phosphor layer 5, and can also prevent that the adhesive material 3 rises from the mounting substrate 2 to adhere on the side faces of the phosphor layer 5.

As illustrated in FIG. 6, the concave cutouts 34 and 44 may be configured in an arc shape. The concave cutouts 34 and 44 can suppress stress concentration when a force is applied from the first guide face 33A and the second guide face 43A in the directions toward each other. It is preferred that the concave cutouts 34 and 44 penetrate in the direction parallel to the guide faces, and the size of the arc is desirably large enough not to come in contact with the phosphor layer 5 of the light emitting element 4. As for the other corners 4a and 4a of the light emitting element 4 where the concave cutout 34 and 44 are not formed, stress concentration can be reduced because the first guide face 33A and the second guide face 43A are separated from each other.

As illustrated in FIG. 5, the step 35 of the first abutting guide 33 and the step 45 of the second abutting guide 43 may be designed such that a part of the guides is apart from the light emitting element 4 further than the first guide face 33A and the second guide face 43A, so as to leave a space for regulating flow of the adhesive material 3 when the guides hold the rectangular phosphor layer 5 by abutting the first to fourth side faces thereof. The steps 35 and 45 have a height that allows the p-pad electrode 6f and the n-pad electrode 6e of the light emitting element 4 to abut the connector electrodes of the mounting substrate 2 to form connection when a thermocompression bonding head 40a abuts and presses the phosphor layer 5.

The pad electrodes of the LED chip 6 may be further provided with conductive connectors (e.g. bumps) or the like, and the conductive connectors may be bonded and electrically connected to the connector electrodes of the mounting substrate 2 via the adhesive material 3.

In this embodiment, for example, the guide mechanism 30 with the above-mentioned configuration is supported by an elevator 50, which is installed on a horizontal conveyer 60.

As illustrated in FIGS. 3 and 4, the elevator 50 may include support platforms 51, 51 respectively supporting the first guide driver 31 and second guide driver 41 of the guide mechanism 30, and elevation drivers 52, 52 to move up and down the support platforms 51, 51. In the embodiment, the elevator 50 is configured such that the guide mechanism 30 abuts and holds the phosphor layer 5 of the light emitting element 4 at the lower end of the operating range, and the guide mechanism 30 conveys the held light emitting element 4 at the upper end of the operating range. The elevator 50 may be a typical elevator such as those driven by a motor, air pressure, hydraulic pressure, magnetic force or the like. The elevator 50 is supported by the horizontal conveyer 60.

The horizontal conveyer 60 supports the elevator 50 to convey the light emitting element 4 from a receiving site (carry-in site) to a mount site. The horizontal conveyer 60 includes for example elevation drivers 52 of the elevator 50, sliding guides 61 supporting the elevation drivers 52, sliding rails 62 to allow movement of the sliding guides 61, and a driver to move the sliding guides 61 along the sliding rails 62 (that is, the horizontal conveyer 60 can move the elevator 50 in a horizontal direction along a predetermined conveyance path). The horizontal conveyer 60 may be a typical conveyer, which moves the elevator 50 by driving force such as motor, air pressure, hydraulic pressure and magnetic force.

The curing mechanism 40 cures the adhesive material 3. The curing mechanism 40 may be any mechanism that can heat the adhesive material 3 high enough to cause curing, and can apply a load so that electrical connection is formed between the light emitting element 4 and the mounting substrate 2. For example, the curing mechanism 40 may include the thermocompression bonding head 40*a*, which is elevatably installed above the mount site where the mounting substrate 2 is placed, to press and heat the light emitting element 4 by abutting the phosphor layer 5 and an elevator mechanism to move up and down the thermocompression bonding head 40*a*.

To apply (supply) the adhesive material 3 on the mounting substrate 2, in this embodiment, an adhesive material supplier 70 is installed around a mount table TBg, which includes a mechanism that can move (rotate, move up and down, extend/retract, or the like) an application nozzle for applying the adhesive material 3 from a retracted position to an applying position. The adhesive material supplier 70 may be installed at a predetermined position according to the interaction with the other components, and may have a configuration of a typical adhesive material supplier (e.g. air or screw dispenser, intaglio printer, metal printer, pad printer, or the like).

The light emitting element mounter 10 of this embodiment is configured such that, for example, the light emitting element 4 is carried in a carry-in table TBa installed at a receiving site for the light emitting element 4 by an element carrying-in means such as handler, and the light emitting device 1 in which the light emitting element 4 is mounted on the mounting substrate 2 is taken out from the mount table TBg by a taking-out means such as handler.

Further, the light emitting element mounter 10 may be configured such that when the mounting substrate 2 is carried in, the adhesive material 3 is applied on the mounting substrate 2 placed on the mount table TBg by the adhesive material supplier 70 for applying the adhesive material 3 on the mounting substrate 2.

Next, an embodiment of a mounting method for mounting the light emitting element 4 on the mounting substrate 2 via the adhesive material 3 by using the light emitting element mounter 10 will be described step by step.

As illustrated in FIGS. 7A and 7B, for example, the mounting substrate 2 is carried in the mount table TBg by a substrate carrying-in means, and then the adhesive material 3 is supplied (applied) on a predetermined area of the mounting substrate 2 by the adhesive material supplier 70. Further, as illustrated in FIG. 7C, the light emitting element 4 is carried in the carry-in table TBa by the element carrying-in means.

Figure 7E:
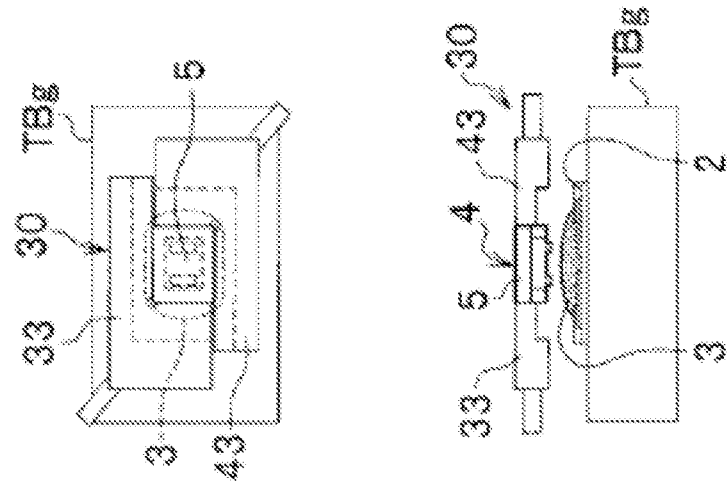
Figure 7D:
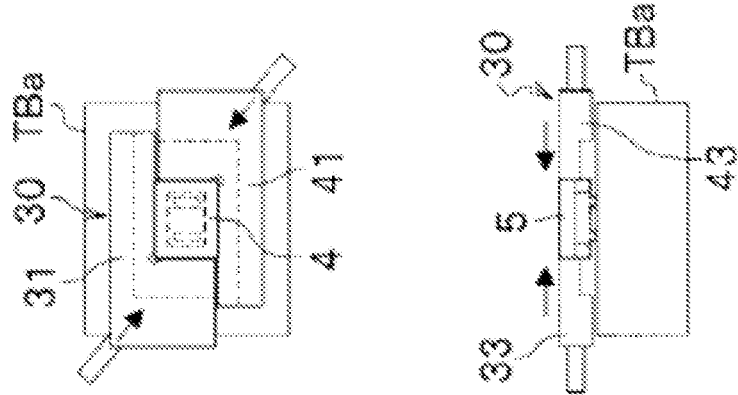

As illustrated in FIGS. 7C and 7D, after carried in the carry-in table TBa by the element carrying-in means, the light emitting element 4 of this embodiment is held by the guide mechanism 30. The guide mechanism 30 holds the light emitting element 4 such that the first guide face 33A of the first abutting guide 33 and the second guide face 43A of the second abutting guide 43 abut the side faces of the phosphor layer 5. Then, as illustrated in FIGS. 3 and 4, while being held by the guide mechanism 30, the light emitting element 4 is lifted up to the upper end by the elevator 50 and is conveyed to above the mounting substrate 2 on the mount table TBg by the horizontal conveyer 60 (FIG. 7E).

As illustrated in FIG. 8A, in this embodiment, when the light emitting element 4 held by the guide mechanism 30 has been conveyed to above the mounting substrate 2 on the mount table TBg by the horizontal conveyer 60, the elevator 50 moves down the guide mechanism 30 so as to move down the light emitting element 4 held by the guide mechanism 30. By the guide mechanism 30 moving down, the light emitting element 4 is placed at the mounting position on the mounting substrate 2 sandwiching the adhesive material 3 while the phosphor layer 5 is being held, so that the n-pad electrode 6*e* and p-pad electrode 6*f* of the light emitting element 4 abut the electrodes of the mounting substrate 2.

As illustrated in FIG. 8B, the curing mechanism 40 moves down the thermocompression bonding head 40*a* to press and heat the light emitting element 4 guided by the guide mechanism 30 so as to join the light emitting element 4 to the mounting substrate 2. In this step, even if the mounting substrate 2 is a flexible substrate made of a low heat-resistant resin material, or if the phosphor layer 5 of the light emitting element 4 is made of a resin material, because the adhesive material 3 is made of an anisotropic conductive material, the light emitting element 4 can be mounted on the mounting substrate 2 at a lower temperature than by using solder.

Figure 9A:
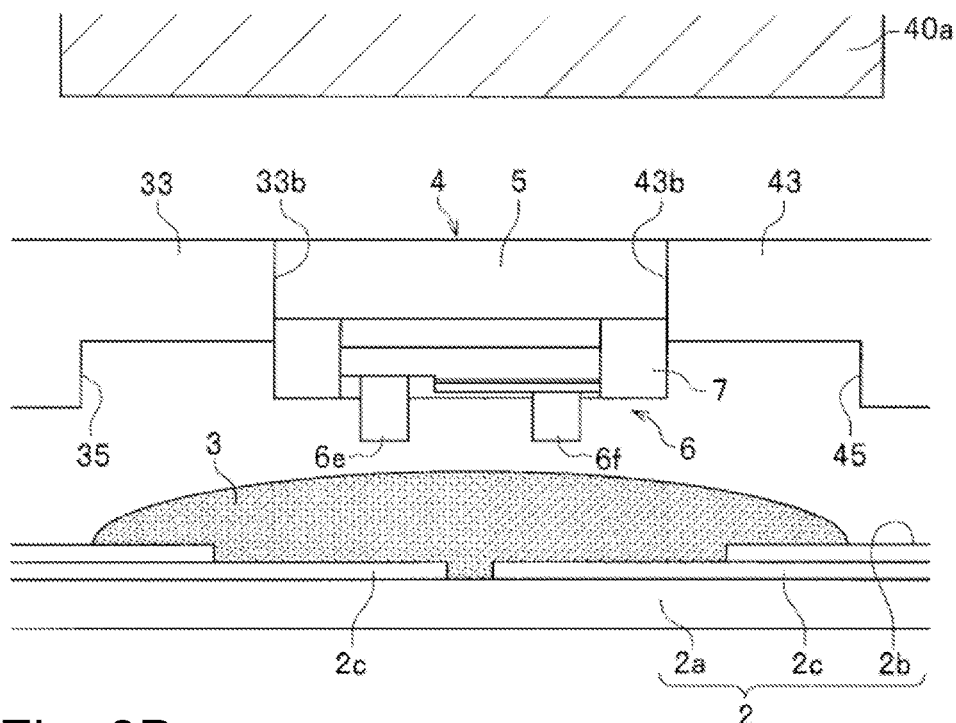
FIG. 9A is an enlarged cutoff view schematically illustrating a state before mounting in the mounting process of the light emitting element according to an embodiment of the present invention.
Figure 9B:
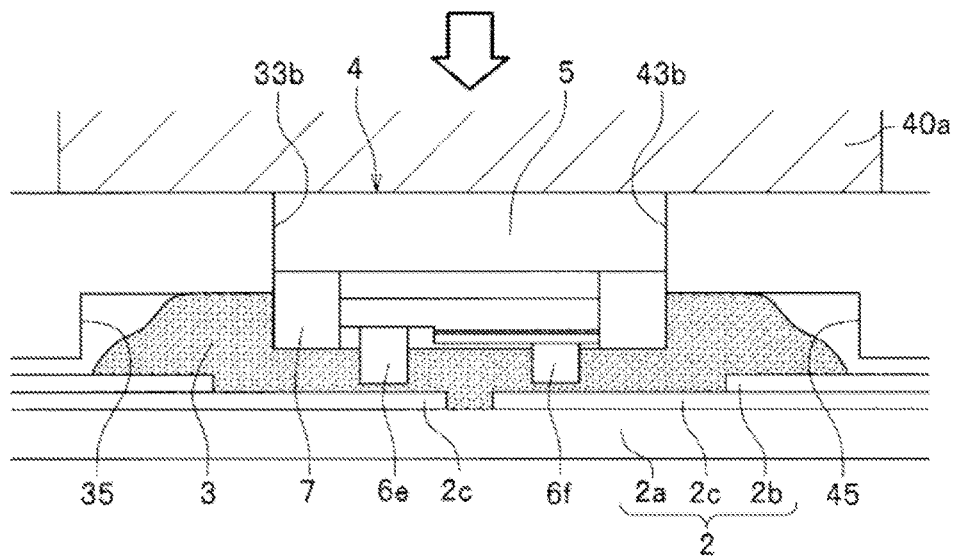
FIG. 9B is an enlarged cutoff view schematically illustrating a state in the middle of mounting in the mounting process of the light emitting element according to an embodiment of the present invention.

As illustrated in FIGS. 9A and 9B, when the curing mechanism 40 applies heat and pressure, the adhesive material 3 might rise from the mounting substrate 2 toward the upper part of the light emitting element 4 (in other words, the adhesive materials 3 flows from the mounting substrate 2 along the side faces of the light emitting element 4 toward the upper part thereof) due to the pressure and heat from the thermocompression bonding head 40*a* and the mount table TBg. When the adhesive material 3 rises (flows toward the upper part), because the first abutting guide 33 and the second abutting guide 43 guide the phosphor layer 5 such that the first guide face 33A (i.e. the guide faces 33*a* and 33*b*) and the second guide face 43A (i.e. guide faces 43*a* and 43*b*) abut the side faces of the phosphor layer 5, the side faces of the phosphor layer 5 can be prevented from adhesion of the adhesive material 3. Furthermore, because the guide mechanism 30 can confine the adhesive material 3 in the space defined by the step 35 of the first abutting guide 33 and the step 45 of the second abutting guide 43, the adhesive material 3 can be regulated within an appropriate area. That is, it can be prevented that the adhesive material 3 spreads and adheres to an unwanted part.

Further, because the concave cutouts 34 and 44 of this embodiment, are interposed respectively between the orthogonal guide faces 33a and 33b and between the orthogonal guide faces 43a and 43b, the first abutting guide 33 and the second abutting guide 43 can suppress stress concentration at the corners 4a of the light emitting element 4. Therefore, in the light emitting element mounter 10, even if the phosphor layer 5 is pressed by the thermocompression bonding head 40a while the first abutting guide 33 and the second abutting guide 43 are holding the phosphor layer 5 by pressing it from opposite abutting directions at a fairly high pressure, the light emitting element 4 can be prevented from breakage or the like.

The term "anisotropic conductive material" means a material that is electrically conductive in one direction but is insulative (or less conductive) in another direction.

The anisotropic conductive material typically includes first resin as a binder and conductive particles dispersed in the binder (the first resin), and optionally includes one or more other components. In this embodiment, the conductive particle can be, for example, a particle of conductive metal such as gold and copper, a fine particle made of solder such as gold-tin base solder, tin-silver-copper base solder and the like, and a particle composed of a core made of second resin and a conductive layer coating the core made of metal such as metals mentioned above. Composition of the anisotropic conductive material (concentrations of the binder resin, the conductive particle and, if exist, the other component), average diameter of the conductive particles, and thickness of the conductive layer can be set appropriately.

The first resin as the binder resin is a thermoset resin and may be, for example, epoxy resin or silicone resin. In some cases, the first resin may be mixed with a thermoplastic resin or the like. The second resin composing the core may be an appropriate resin such as methacryl resin and the like. As for the first resin and the second resin, the ratio of the absolute value of difference between heat expansion coefficient of the first resin $k_1$ and heat expansion coefficient $k_2$ to the heat expansion coefficient $k_1$ ($=|k_2-k_1|/k_1$) is preferably 1.0 or less, more preferably 0.5 or less, and further more preferably 0.2 or less. Combination of the first resin and the second resin includes, for example, epoxy resin and methacryl resin, and epoxy resin and silicone resin. The first resin and the second resin may be different resin. Alternatively, the first resin and the second resin may be a same resin (in this case, the ratio mentioned above is zero).

The conductive layer of the conductive is made of metal such as Au and Ni. The conductive layer can be formed on the core by way of, for example, non-electrolytic plating, electrolytic plating, mechano-fusion (mechanochemical reaction) or the like. The amount of the conductive particles contained in the anisotropic conductive material is not limited specifically and can be selected arbitrally.

The other component(s) contained in the anisotropic conducive material includes, for example, filler and/or an additive such as curing accelerator, viscosity modifier and the like. Filler may be made of a material having higher heat conductivity than that of the binder resin, for example a particle such as a metal oxide (e.g. titanium oxide, alumina or the like) particle, a metal nitride particle (e.g. aluminum nitride or the like) and a carbon particle. The particle generally has a smaller particle size than that of the conductive particle. The anisotropic conductive material preferably includes reflective material which enhances light reflectivity thereof. As the reflective material, titanium oxide, silica dioxide, titanium dioxide, zirconium dioxide, potassium titanate, alumina, aluminum nitride, boron nitride and the like can be used.

The adhesive material 3, which is an anisotropic conductive material, establishes electrical conduction at the bonded portion in the thickness direction (i.e. between the light emitting element 4 and the electrodes of the mounting substrate 2) when it is subjected to a certain heat and pressure (thermocompression bonding) so that the binder is pushed out and at least one of the conductive particles is sandwiched between the opposing light emitting element 4 and the electrodes of the mounting substrate 2, while it exhibits insulation property in the in-plane direction (i.e. in the direction approximately parallel to the mounting face of the mounting substrate 2).

The light emitting device according to an embodiment of the present invention utilize the capability of an anisotropic conductive material of forming an electrically conductive path between the light emitting element 4 and the electrodes of the mounting substrate 2 at a lower temperature than by using conventional materials such as solder. That is, the insulation property in the in-plane direction is not an essential feature. However, short-circuit in a light emitting element 4 and/or a mounting substrate 2 where both positive electrode and negative electrode are disposed on one surface side can be effectively prevented by having the insulation property in the in-plane direction.

In the light emitting element mounter 10 of this embodiment, after the heat and pressure is applied for a predetermined period of time, the thermocompression bonding head 40a moves up to be separated from the light emitting element 4 as illustrated in FIGS. 8C and 8D. The thermocompression bonding process (mounting process) is thus complete. After the thermocompression bonding head 40a moves up, the guide mechanism 30 is also separated from the phosphor layer 5 of the light emitting element 4. Then, the guide mechanism 30 is moved to the upper end by the elevator 50, and is moved to the carry-in table TBa by the horizontal conveyer 60. At this moment, it is preferred in terms of improving the takt time of the mounting process that the next light emitting element 4 has been already carried in the carry-in table TBa. After the guide mechanism 30 is moved to the carry-in table TBa by the horizontal conveyer 60, the light emitting device 1 is taken out and send to the next process by the taking-out means. Then, the next mounting substrate 2 is carried in the mount table TBg, and the above-mentioned steps of FIGS. 7A through 7E and 8A through 8D are sequentially repeated so that the mounting process of the light emitting element 4 is performed.

In the light emitting element mounter 10 of this embodiment as described above, because the guide mechanism 30 abuts the phosphor layer 5 of the light emitting element 4 during the thermocompression bonding process (mounting process), the mounted light emitting element 4 can be prevented from deformation of the phosphor layer 5 and from adhesion of the adhesive material 3 on the phosphor layer 5, which results in high light extraction efficiency of the light emitting device 1. Further, in the light emitting element mounter 10, because an anisotropic conductive material is used for the adhesive material 3, the mounting process can be performed at a lower temperature than by using solder.

Another embodiment of a light emitting element mounter 10B will be described below with reference to FIGS. 10 and 11, which differs in the means for conveying the light emitting element 4. The previously described components are indicated by the same reference signs, and the descriptions thereof are omitted.

Figure 10:
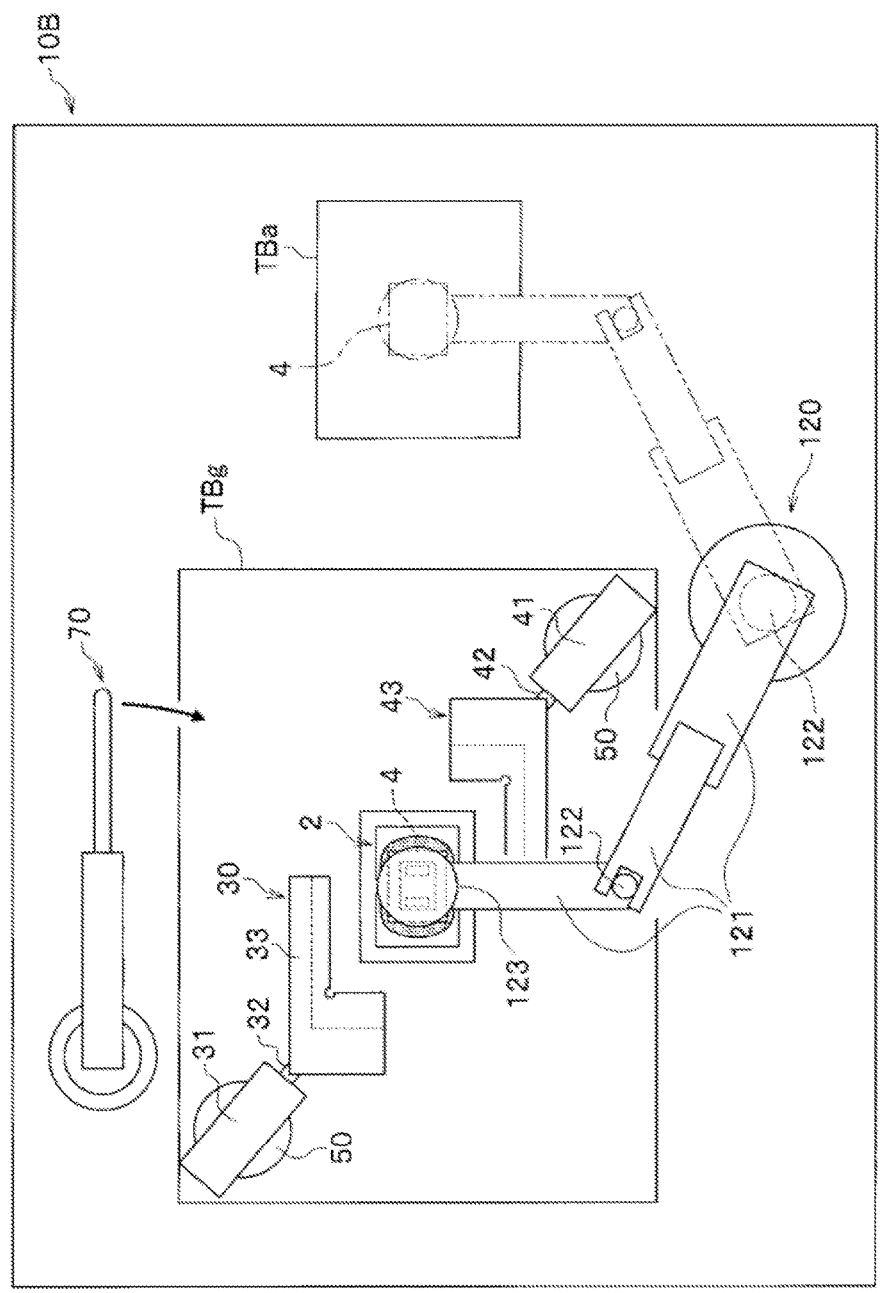
FIG. 10 is a plan view schematically illustrating another light emitting element mounter according to an embodiment of the present invention.

As illustrated in FIG. 10, the light emitting element mounter 10B includes a robot arm conveyer 120 as the conveying means, and is configured such that a guide mechanism 30 and an elevator 50 are installed on a mount table TBg.

In this embodiment, the light emitting element mounter 10B includes the robot arm conveyer (conveying apparatus) 120 to convey the light emitting element 4 to place it on a mounting substrate 2, a guide mechanism 30 to guide the light emitting element 4 conveyed to the mounting substrate 2 from a carry-in table TBa by the robot arm conveyer 120, an elevator 50 to move up and down the guide mechanism 30, an adhesive material supplier 70 to supply an adhesive material 3 to the mounting substrate 2, a curing mechanism 40 to cure the adhesive material 3 to mount the light emitting element 4 guided by the guide mechanism 30 moved down by the elevator 50 to the mounting substrate 2.

The robot arm conveyer 120 may hold the upper face of the light emitting element 4 by suction to convey it from the carry-in table TBa to a mount table TBg where the mounting substrate 2 is placed. The robot arm conveyer 120 may bend, move up and down or rotate by being driven by rotational axis mechanisms 122 provided at a base and a joint of the arm 121, so as to convey the light emitting elements 4 that is held by suction on a suction holder 123 provided on the distal end of the arm 121. The robot arm conveyer 120 may be a typical robot arm that is used for conveying the light emitting element 4.

The guide mechanism 30 may be installed at or around the periphery (in this embodiment, at the periphery) of the mount table TBg via the elevator 50.

Figure 11A:
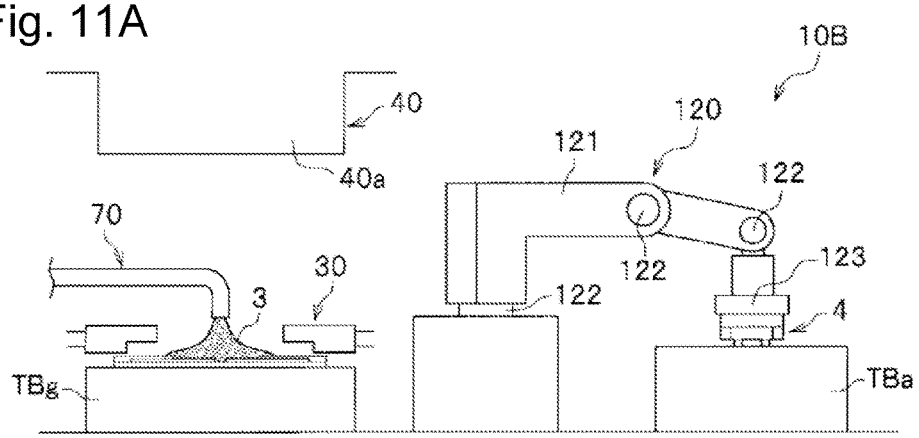
FIGS. 11A to 11C are schematic views illustrating the mounting process in another light emitting element mounter according to an embodiment of the present invention.

As illustrated in FIG. 11A, in the light emitting element mounter 10B, the light emitting element 4 carried in the carry-in table TBa is held by suction by the suction holder 123 of the robot arm conveyer 120, and is conveyed to the mount table TBg. At the mount table TBg, the mounting substrate 2 is carried in, and the adhesive material 3 is supplied (applied) on the mounting substrate 2 by the adhesive material supplier 70.

Figure 11B:
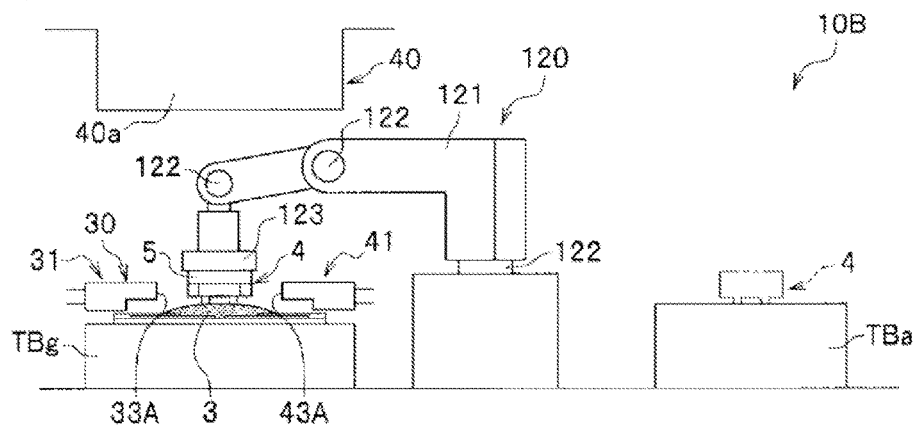
Figure 11C:
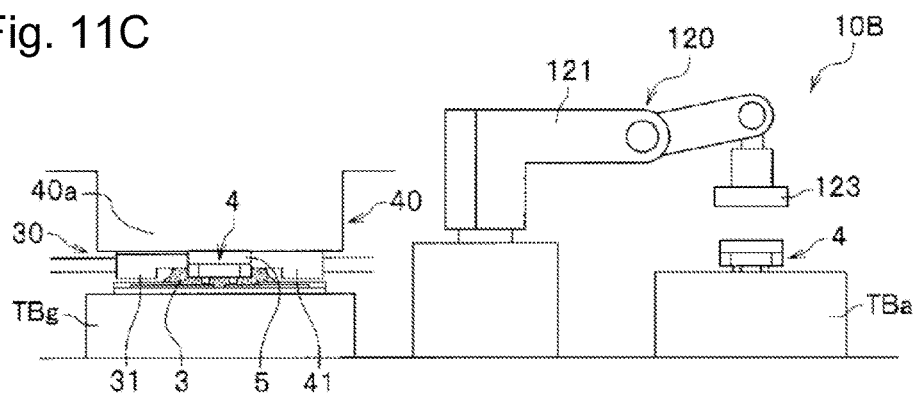

As illustrated in FIGS. 11B and 11C, in the light emitting element mounter 10B, after the light emitting element 4 is conveyed and placed on the mounting substrate 2 sandwiching the adhesive material 3 by the robot arm conveyer 120, the side faces of the phosphor layer 5 of the light emitting element 4 are guided by the guide mechanism 30.

The guide mechanism 30 holds the light emitting element 4 such that a first guide face 33A and a second guide face 43A abut the side faces of the phosphor layer 5 of the light emitting element 4. Then, in the light emitting element mounter 10B, the elevator 50 moves down the guide mechanism 30 so that an n-pad electrode 6e and a p-pad electrode 6f of the light emitting element 4 are opposed to connector electrodes of the mounting substrate 2 across the adhesive material 3 while the phosphor layer 5 is being guided (or held) by the guide mechanism 30. A curing mechanism 40 presses and heats the light emitting element 4 by a thermocompression bonding head 40a and the mount stage TBg to cure the adhesive material 3 so as to mount the light emitting element 4 on the mounting substrate 2. At this moment, because the phosphor layer 5 of the light emitting element 4 is guided by (or in contact with) the first guide face 33A and second guide face 43A of the guide mechanism 30, the phosphor layer 5 is prevented from deformation. Furthermore, the light emitting element 4 can be mounted such that the side faces of the phosphor layer 5 are exposed from the adhesive material 3.

In the light emitting element mounter 10B, because the guide mechanism 30 is installed on the mount table TBg, the conveyance of the light emitting element 4 by the robot arm conveyer 120 can be separated from the guide operation of the phosphor layer 5 by the guide mechanism 30 (i.e. it is possible to perform the conveyance of one light emitting element 4 by the robot arm conveyer 120 and the guide operation (holding) of the phosphor layer 5 of another light emitting element 4 by the guide mechanism 30 at the same time). Therefore, the takt time of mounting the light emitting element can be improved.

Figure 12A:
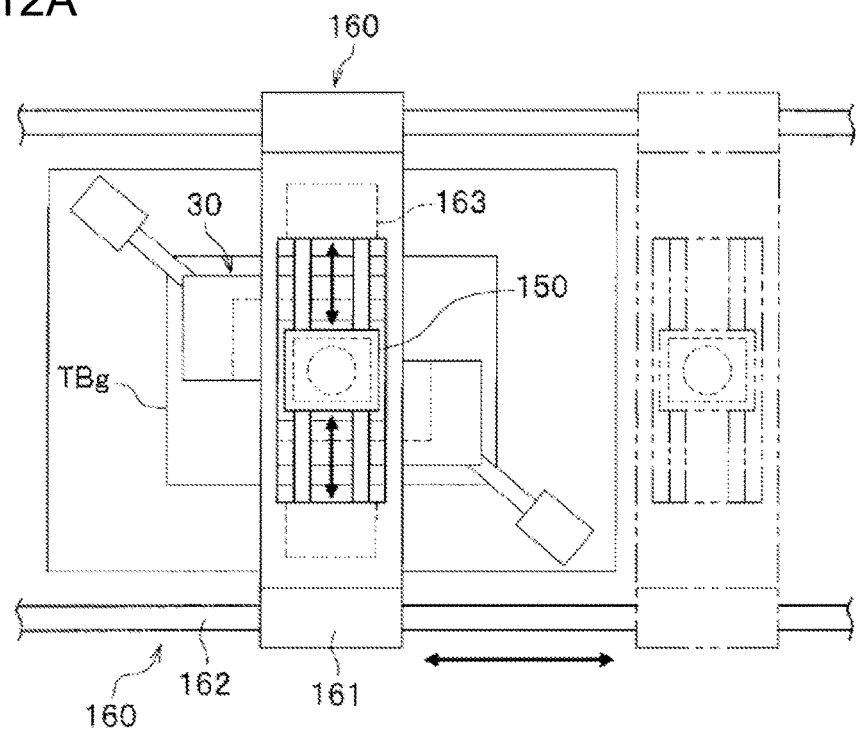
FIGS. 12A and 12B are top and side views schematically illustrating another horizontal conveyer of a light emitting element mounter according to an embodiment of the present invention.
Figure 12B:
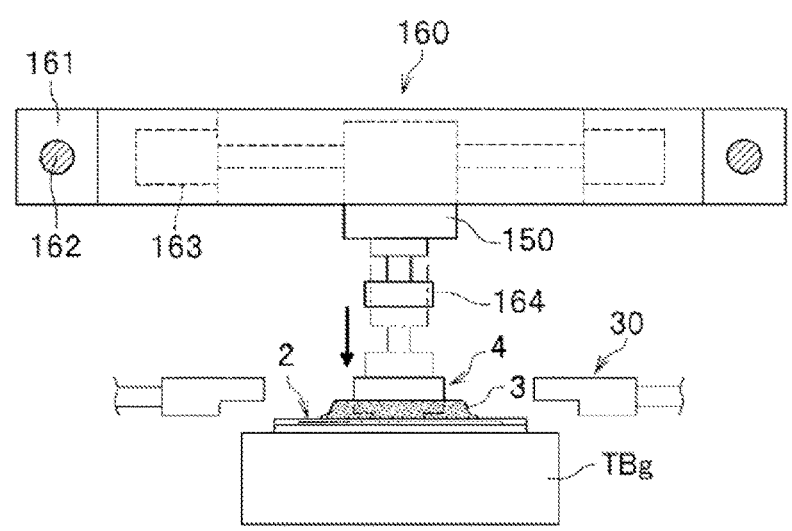

The means for conveying the light emitting element 4 from the carry-in table TBa to the mount table TBg may be a horizontal conveyer 160 as illustrated in FIG. 12 instead, which includes a suction holder 164 movable up and down, and can perform horizontal conveyance. The horizontal conveyer 160 is capable of moving the suction holder 164 also in the direction perpendicular to the conveyance direction by means of a moving member 163 so as to adjust the position of the suction holder 164. The suction holder 164 is also movable up and down by means of the elevator 150 provided in the moving member 163. The moving member 163 is installed on the sliding guide 161, and the sliding guide 161 is movable along the sliding rail 162. By using the horizontal conveyer 160, the guide mechanism 30 can be installed on the mount table TBg without interposing the elevator 150.

As described above, the light emitting device 1 has high luminous efficiency because the phosphor layer 5 can be prevented from adhesion of the adhesive material 3. Furthermore, the light emitting device 1 has high mount strength because the adhesive material 3 adheres to the side faces of the light reflective component layer 7 as well, which is advantageous when applied to a variety of light sources.

In the light emitting element 1 according to an embodiment of the present invention, because the LED chip 6 is mounted on the substrate by using an anisotropic conductive material as the adhesive material 3, the mounting process can be performed at a lower temperature than by using solder, which ensures high reliability of the circuit and the like. Furthermore, the low-temperature mounting process reduces the limitations for the material, which enables using a flexible substrate for the light emitting device 1 without sacrificing reliability.

In the light emitting element mounting method according to an embodiment of the present invention, while the guide mechanism 30 is abutting the side faces of the phosphor layer 5, the curing mechanism 40 applies heat and pressure by abutting the phosphor layer 5 from the upper side of the phosphor layer 5 so as to mount the light emitting element 4 on the substrate 2 via the adhesive material 3 of an anisotropic conductive material. By guiding the phosphor layer 5, the guide mechanism 30 can prevent the phosphor layer 5 from deformation, and can also prevent the phosphor layer 5 from overall adhesion of the adhesive material 3. Therefore, in the light emitting element mounting method, the light emitting element 4 can be mounted on the substrate 2 at a low temperature than by using solder, which ensures high reliability of the circuit and the like. Furthermore, high light extraction efficiency can be ensured.

In the light emitting element mounter 10 according to an embodiment of the present invention, an anisotropic conductive material is used for the adhesive material 3, and the curing mechanism 40 applies pressure and heat to perform the mounting process while the guide mechanism 30 is holding the phosphor layer 5. Therefore, the process can be performed at a lower temperature than by using solder. Furthermore, deformation can be prevented even if a soft material such as flexible substrate is used or if the side faces of the LED chip 6 are made of a soft material such as resin. As a result, in the light emitting element mounter 10, the mounted light emitting element 4 can be prevented from developing undesired light distribution, poor color uniformity and/or decreased brightness. Furthermore, the light extraction efficiency can be improved.

In the light emitting element mounters 10 and 10B according to embodiments of the present invention, and the mounting method according to embodiments of the present invention, because the phosphor layer 5 of the light emitting element 4 is guided by the guide mechanism 30, the adhesive material 3 can be prevented from adhering to the phosphor layer 5.

In the embodiments, the adhesive material 3 is basically made of an ACP (anisotropic conductive paste), which is in a paste (liquid) state before being cured. However, the adhesive material 3 may be made of an ACF (anisotropic conducive film).

In the embodiments, the light emitting element 4 includes the LED chip 6, the phosphor layer 5 and the light reflective component layer 7. However, it may not include the light reflective component layer 7 (i.e. includes only the LED chip 6 and the phosphor layer 5). As illustrate in FIG. 13, a light emitting element 4A of this configuration does not include the light reflective component layer 7, but includes the phosphor layer 5 covering the upper and side faces of the LED chip 6. It is preferred that the adhesive material 3 of a light emitting device 1A covers the side faces of the phosphor layer 5 of the light emitting element 4A to the extent to provide good adhesion without causing any problem with the light extraction.

The light emitting device of the present invention is applicable to a variety of light sources such as illumination light sources, light sources of various indicators, vehicle light sources, display light sources, light sources of LCD back light, traffic signals, vehicle components and channel letters of sign boards.

While the a light emitting element, a light emitting element mounting method, and a light emitting element mounter according to the embodiments of the present invention have been described above, the present invention is not limited to the above embodiments.

It is apparent that various modifications and changes can be made to the disclosed embodiments based on the above description without departing from the scope of the claims.

What is claimed is:

1. A light emitting device comprising:
   a light emitting element comprising an LED chip and a phosphor layer provided on a light emitting side of the LED chip; and
   a substrate on which the light emitting element is bonded by an adhesive material, the substrate comprising:
      a base,
      a plurality of connector electrodes disposed so as to extend laterally over portions of the base, and
      a substrate light reflective component layer disposed so as to directly contact and extend laterally over a portion of the base and a portion of each connector electrode, the substrate light reflective component layer being separated from the LED chip,
      an LED chip light reflective component layer extending laterally around at least a part of a lateral face of the LED chip,
   wherein the adhesive material is an anisotropic conductive material,
   wherein the adhesive material includes a first portion that contacts and extends laterally over a portion of the substrate light reflective component layer, a second portion that is disposed between the LED chip light reflective component layer and the substrate, and a third portion that extends laterally around at least a part of a lateral face of the LED chip light reflective component layer, and wherein the first, second, and third portions of the adhesive material are continuous with one another, and
   wherein at least part of a lateral face of the phosphor layer is exposed from the adhesive material.

2. The light emitting device according to claim 1, wherein the LED chip light reflective component layer is provided on the LED chip such that the LED chip light reflective component layer is continuous with the phosphor layer.

3. The light emitting device according to claim 1, wherein the LED chip light reflective component layer is harder than the phosphor layer.

4. The light emitting device according to claim 3, wherein the LED chip light reflective component layer is provided on the LED chip such that the LED chip light reflective component layer is continuous with the phosphor layer.

5. The light emitting device according to claim 3, wherein the LED chip light reflective component layer includes titanium oxide.

6. The light emitting device according to claim 3, the phosphor layer covers upper faces of the LED chip light reflective component layer and the LED chip.

7. The light emitting device according to claim 1, wherein the adhesive material electrically connects electrodes of the LED chip to corresponding ones of the connector electrodes of the substrate.

8. The light emitting device according to claim 1, wherein the anisotropic conductive material is electrically conductive in one direction and is insulative in another direction.

9. The light emitting device according to claim 1, wherein the LED chip light reflective component layer includes titanium oxide.

10. The light emitting device according to claim 1, wherein an upper face of the adhesive material is flat and located lower than an upper face of the LED chip.

11. The light emitting device according to claim 1, wherein the substrate is a flexible substrate.

12. The light emitting device according to claim 1, the phosphor layer covers upper faces of the LED chip light reflective component layer and the LED chip.

13. The light emitting device according to claim 1, wherein, in a plan view of the light emitting device, the substrate light reflective component layer is located outside of an outer periphery of the light emitting element.

14. A light emitting device comprising:
   a light emitting element comprising an LED chip and a phosphor layer provided on a light emitting side of the LED chip; and
   a substrate on which the light emitting element is bonded by an adhesive material, the substrate comprising:
      a base,
      a plurality of connector electrodes disposed so as to extend laterally over portions of the base, and
      a substrate light reflective component layer disposed so as to directly contact and extend laterally over a portion of the base and a portion of each connector electrode, the substrate light reflective component layer being separated from the LED chip, an LED chip light reflective component layer extending laterally around at least a part of a lateral face of the LED chip, wherein the adhesive material is an anisotropic conductive material, wherein the adhesive material includes a first portion that contacts and extends laterally over a portion of the substrate light reflective component layer, a second portion that is disposed between the LED chip light reflective component and the substrate, and a third portion that extends laterally around at least a part of a lateral face of the LED chip light reflective component layer, and wherein the first, second, and third portions of the adhesive material are continuous with one another, and wherein an upper face of the adhesive material is flat and located lower than an upper face of the LED chip.

* * * * *